United States Patent [19]

Kock

[11] 4,386,268
[45] May 31, 1983

[54] ENVELOPE FOR A PHOTODIODE

[75] Inventor: Hendrikus G. Kock, Eindhoven, Netherlands

[73] Assignee: U.S. Philips Corporation, New York, N.Y.

[21] Appl. No.: 205,817

[22] Filed: Nov. 10, 1980

[30] Foreign Application Priority Data

Nov. 23, 1979 [NL] Netherlands ................... 7908536

[51] Int. Cl.³ ............................................. G02B 5/14
[52] U.S. Cl. ................................. 250/227; 250/239; 350/96.20
[58] Field of Search ........................... 250/227, 239; 350/96.20

[56] References Cited

U.S. PATENT DOCUMENTS 4,233,619 11/1980 Webb et al. ................. 350/96.2 X
4,241,978 12/1980 Dubois et al. ................. 350/96.2

*Primary Examiner*—David C. Nelms
*Assistant Examiner*—Darwin R. Hostetter
*Attorney, Agent, or Firm*—Thomas A. Briody; Robert T. Mayer; Steven R. Biren

[57] ABSTRACT

An envelope for a photodiode which serves as a detector of light signals comprises a support and a metal cap-shaped member connected hermetically to the support. A metallized glass light conductor passed through an aperture of the cap-shaped member is connected in the aperture by means of solder. One end of the light conductor extends up to the photodiode; the other end projects from the cap-shaped member and is surrounded by the wall of an aperture on one side of a blocked-shaped member, in which aperture an optical fiber can be incorporated on the other side.

3 Claims, 1 Drawing Figure

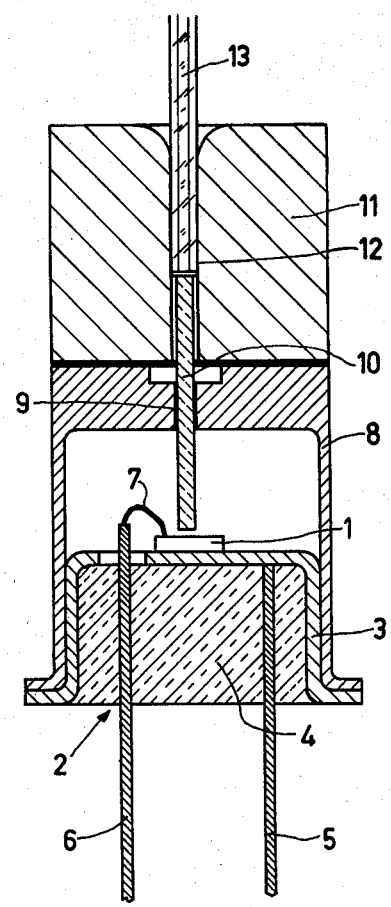

ENVELOPE FOR A PHOTODIODE

BACKGROUND OF THE INVENTION

The invention relates to an envelope for a photodiode which serves as a detector of light signals.

For optical communication, an avalanche breakdown diode is often used as a detector of light signals. The light signals are presented to the detector via a glass fiber. The distance between the end of the fiber and the photodiode should be very small so as to obtain an efficient optical coupling. When this distance is larger than approximately 0.1 mm, a considerable part of the light presented by the fiber will fall beyond the photosensitive part of the detector. Obtaining this small distance in a reproducible manner is difficult in practice.

As is known, it is desirable for the avalanche breakdown diode to have a dark current which is as small as possible. In order to avoid an increase in the dark current, the avalanche breakdown diode should be incorporated in a hermetic envelope. However, this in turn adds to the problems which occur in realizing an efficient optical coupling between the detector and the optical fiber.

SUMMARY OF THE INVENTION

It an the object of the invention to provide an envelope for a photodiode which ensures a hermetic seal of the photodiode and permits an efficient optical coupling between the detector and an optical fiber in a reproducible manner. In order to achieve this object, an envelope according to the invention is characterized in that the envelope comprises a support for the photodiode, a metal cap-shaped member connected hermetically to the support, a metallized glass light conductor which is passed through an aperture of the cap-shaped member and which is connected in the aperture by means of solder and one end of which extends up to the photodiode and the other end of which projects from the cap-shaped member, and a block-shaped member which is placed on the cap-shaped member, said block-shaped member comprising a bore in which on one side a part of the light conductor is located and on the other side an optical fiber can be incorporated.

The support and the cap-shaped member are preferably connected together by means of a welded joint. Since furthermore the light conductor is soldered in the cap-shaped member, an absolutely hermetically sealed envelope is obtained. Prior to soldering, the light conductor can be adjusted in the cap-shaped member in such manner that there is a minimum distance between one of its ends and a photodiode on the support. The block-shaped member can now be secured to the cap-shaped member in a simple manner, for example, by means of a glued joint. A bore in the block-shaped member receives the projecting part of the light conductor; the light conductor is thus protected effectively. An optical fiber can be threaded into the bore towards the light conductor. As a result of this a very simple coupling of the optical fiber has become possible, with the light transmission to the photodiode being maximized.

The glass light conductor preferably has a step-like transition of the index of refraction of the glass in a direction transverse to the direction of light conduction. It has been found that an effective light conduction then takes place.

BRIEF DESCRIPTION OF THE DRAWING

The invention will be described in greater detail with reference to an embodiment of the envelope shown in the single FIGURE of the drawing.

DETAILED DESCRIPTION

A support 2 for an avalanche breakdown photo diode 1 consists of a metal member 3 the lower side of which is filled with glass 4. An electrical conductor 5 is passed through the glass and is connected to the metal member 3. Another electrical conductor 6 is passed through the glass and through an aperture of the metal member 3, so that the conductors 5 and 6 are mutually electrically insulated. The avalanche breakdown diode is connected on the metal member 3 and is thus connected electrically to conductor 5. A wire 7 provided between the upper side of the avalanche breakdown diode and the conductor 6 constitutes the electric connection of the diode with conductor 6.

A metal cap-shaped member 8 is welded with its flange to a flange of the metal member 3. A continuous aperture 9 is present in the upper side of the cap-shaped member 8. A glass light conductor 10 is passed through said aperture. This light conductor is provided with a metallization at least at the area where it is passed through the aperture. The metallization preferably consists of a layer of NiCr on which there is a layer of Ni. The light conductor is secured in the aperture 10 by means of solder. By using the welded joint between the metal part 3 and the cap-shaped part 8 and by using the soldered joint, a hermetic envelope of an excellent quality has been obtained. The light conductor 10 is positioned in the aperture 9 and then soldered in such manner that its end facing the photodiode 1 extends up to a very short distance from the said diode. This distance, which preferably should not be larger than 0.1 mm, can be adjusted in a reproducible manner by the construction as shown.

The envelope furthermore comprises a block-shaped member 11 which is present on the cap-shaped member 8. This block-shaped member 11 has a bore 12. The part of the light conductor projecting from the cap-shaped member fits in the bore 12. The block-shaped member 11 may consist of any material, for example synthetic resin or metal, and may be connected to the cap-shaped part 8 in any suitable manner, for example by means of a glue. Thus one end of the bore 12 accommodates the end of the light conductor projecting from the cap 8 while the other end can accommodate an optical fiber 13 which provides a light signal to be detected by the avalanche breakdown diode 1. The threading of the fiber 13 is facilitated by rounding-off the bore 12. The fiber can be guided towards the light conductor in a simple manner. The fiber can be glued so that its position is fixed. By using the envelope as shown, a very simple mechanical coupling and an extremely effective optical coupling between the optical fiber and the avalanche breakdown diode is obtained. The light conductor is preferably constructed so that in a direction transverse to the direction of light conduction, the index of refraction of the glass shows a step-like transition.

What is claimed is:

1. An envelope for a photodiode which serves as a detector of light signals, said envelope comprising a support for the photodiode, a metal cap-shaped member fastened hermetically to the support and having an aperture above the photodiode, a metallized glass light conductor which is passed through said aperture of the cap-shaped member and which is soldered to said member in the aperture, one end of said light conductor extending towards the support for the photodiode and the other end thereof projecting from the cap-shaped member, a block-shaped member on the cap-shaped member, said block-shaped member comprising a bore which on one side houses the projecting end of the light conductor and on the other side houses an optical fiber which is optically coupled to the light conductor.

2. An envelope for a photodiode as claimed in claim 1, wherein the support comprises a metal bottom part which is secured to the cap-shaped member by means of a welded joint and the block-shaped member is connected to the cap-shaped member by means of a glue.

3. An envelope for a photodiode as claimed in claim 1, wherein the glass light conductor has a step-like transition of the index of refraction of the glass in a direction transverse to the direction of light conduction.

* * * * *